(12) United States Patent
Sato

(10) Patent No.: US 7,777,253 B2
(45) Date of Patent: Aug. 17, 2010

(54) FIELD-EFFECT SEMICONDUCTOR DEVICE

(75) Inventor: Ken Sato, Saitama (JP)

(73) Assignee: Sanken Electric Co., Ltd. (JP)

( * ) Notice: Subject to any disclaimer, the term of this patent is extended or adjusted under 35 U.S.C. 154(b) by 226 days.

(21) Appl. No.: 12/117,380

(22) Filed: May 8, 2008

(65) Prior Publication Data

US 2008/0283870 A1    Nov. 20, 2008

(30) Foreign Application Priority Data

May 18, 2007    (JP)    ............... 2007-132801

(51) Int. Cl.
*H01L 31/0328* (2006.01)
*H01L 31/0336* (2006.01)
*H01L 31/072* (2006.01)
*H01L 31/109* (2006.01)

(52) U.S. Cl. ............... 257/194; 257/195; 257/E29.246; 257/E29.247; 257/E29.248

(58) Field of Classification Search ......... 257/194–195, 257/E29.246, E29.247, E29.248, E29.252, 257/E29.253

See application file for complete search history.

(56) References Cited

U.S. PATENT DOCUMENTS 7,468,524 B2 * 12/2008 Teraguchi ............... 257/27

FOREIGN PATENT DOCUMENTS

| JP | 2005-183733 | 7/2005 |
| JP | 2006-156816 | 6/2006 |

* cited by examiner

*Primary Examiner*—Thien F Tran
(74) *Attorney, Agent, or Firm*—Woodcock Washburn LLP

(57) ABSTRACT

A HEMT-type field-effect semiconductor device has a main semiconductor region comprising two layers of dissimilar materials such that a two-dimensional electron gas layer is generated along the heterojunction between the two layers. A source and a drain electrode are placed in spaced positions on the main semiconductor region. Between these electrodes, with spacings therefrom, an insulator is provided with is made from a material capable of developing a stress to reduce carrier concentration in neighboring part of the two-dimensional electron gas layer, creating a discontinuity in this layer. A gate electrode overlies the insulator via a piezoelectric layer which is made from a material capable of developing, in response to a voltage applied to the gate electrode, a stress for canceling out the stress developed by the insulator. Thus the device is physically held off by the action of the insulator while no voltage is being impressed to the gate electrode and, upon voltage application thereto, piezoelectrically turns on by the action of the piezoelectric layer. The turn-on resistance of the device is relatively low as the insulator occupies only part of the source-drain spacing.

11 Claims, 3 Drawing Sheets

FIELD-EFFECT SEMICONDUCTOR DEVICE

CROSS REFERENCE TO RELATED APPLICATIONS

This application claims priority to Japanese Patent Application No. 2007-132801, filed May 18, 2007.

BACKGROUND OF THE INVENTION

This invention relates to semiconductor devices in general and, in particular, to field-effect semiconductor devices as typified by high electron mobility transistors (HEMTs).

The HEMT of typical prior art design comprises an electron transit layer of undoped gallium nitride (GaN) grown on a substrate of silicon, sapphire or the like via a buffer layer, an electron supply, or barrier, layer of n-doped or undoped aluminum gallium nitride (AlGaN) on the electron transit layer, and a source, drain and gate electrode on the electron supply layer. The AlGaN electron supply layer has a greater bandgap and less lattice constant than the GaN electron transit layer.

Overlying the electron transit layer of a greater lattice constant, the electron supply layer experiences an expansive strain (tensile stress) and so gives rise to piezoelectric depolarization. The AlGaN electron supply layer is also subject to spontaneous depolarization. The piezoelectric and spontaneous depolarizations of the heterojunction between the electron transit layer and electron supply layer create what is known as a two-dimensional electron gas layer in neighboring part of the electron supply layer. The two-dimensional electron gas layer provides a path, usually referred to as a channel, of current flow between the drain and source electrodes. This current flow is controllable by a bias voltage impressed to the gate electrode.

The HEMT of the foregoing general construction was normally on, there having been a source-drain current flow while no voltage was being applied to the gate electrode. It had to be turned off using a negative power supply for causing the gate electrode to gain a negative potential. Use of such a negative power supply made the associated electric circuitry unnecessary complex and expensive. The conventional normally-on HEMT was therefore rather inconvenient of use.

Attempts have been made to devise a HEMT that is normally off. One known approach to that end is by making the AlGaN electron supply layer thinner. A thinner electron supply layer weakens the field of the electron supply layer due to piezoelectric and spontaneous depolarizations, resulting in the diminution of electron concentration in the two-dimensional electron gas layer. The two-dimensional electron gas layer disappears at its part just under the gate when a field due to the potential difference, with no built-in potential or bias voltage, between the electron supply layer and, making Schottky contact therewith, the gate electrode acts upon the two-dimensional electron gas layer of reduced electron concentration. The HEMT can thus be held off between the drain and base electrodes without application of a bias voltage to the gate.

However, the normally-off HEMT based upon this conventional scheme proved to possess the drawback that, by reason of the thin electron supply layer itself, the two-dimensional electron supply layer suffered an unnecessary drop in electron concentration at other than right below the gate, too. The result was an inconveniently high drain-source turn-on resistance.

A solution to this inconvenience is found in Japanese Unexamined Patent Publication No. 2005-183733. It teaches to make the electron supply layer thinner only under the gate by creating a recess in that layer. This solution is unsatisfactory in that the creation of the recess by selective etching of the electron supply layer is likely to lead to the impairment of the crystalline structure of the electron supply layer, as well as that of the electron transit layer, and hence to the deterioration of the electrical characteristics of the HEMT. What is worse, in desired mass production of the normally-off HEMTs, their threshold voltage will fluctuate from one device to another if, as is very likely to occur, their electron supply layers are not etched to an exactly unvarying depth. For these reasons, as far as the applicant is aware, there seem to be no normally-off HEMTs of the above known scheme that are currently available on the market.

Japanese Examined Patent Publication No. 2006-156816 makes a different approach to a normally-off HEMT. It suggests to make the electron supply layer greater in lattice constant than the electron transit layer. Further, in this prior art normally-off HEMT, a piezoelectric layer is placed wholly between the source and drain electrodes on the electron supply (or barrier) layer, and the gate electrode overlies the piezoelectric layer.

In this case a two-dimensional electron gas layer must appear throughout the heterojunction between the electron supply layer and electron transit layer upon voltage application to the gate electrode. This objective makes it necessary that the piezoelectric layer cover the entire spacing between the source and drain electrodes on the surface of the electron supply layer, and that the gate electrode be as large as surface area as feasible. These necessities in turn impose limits on the spacings of the gate electrode from the source and drain electrodes and hence on gate-source and gate-drain antivoltage strengths. Conversely, should the gate electrode be made smaller in size for higher antivoltage strengths, the two-dimensional electron gas layer might not be formed throughout the heterojunction, resulting in a rise in turn-on resistance.

SUMMARY OF THE INVENTION

The present invention has it as an object to render field-effect semiconductor devices of the kind defined, capable of normally-off operation.

Another object of the invention is to reduce the turn-on resistance of the devices to a minimum in attaining the first recited object of the invention.

Briefly, the invention may be summarized as a field-effect semiconductor device capable of normally-off operation, comprising a main semiconductor region having a first and a second layer of dissimilar semiconducting materials such that a two-dimensional carrier gas layer is generated along a heterojunction therebetween. The main semiconductor region has a source and a drain electrode in spaced positions on its major surface. Placed between these electrodes, with spacings from both, on the major surface of the main semiconductor region is an insulator made from a material such that a stress is thereby developed to reduce carrier concentration in neighboring part of the two-dimensional carrier gas layer in the main semiconductor region. A gate electrode overlies the insulator for control of conduction between the source electrode and drain electrode. Interposed between the gate electrode and insulator, a piezoelectric layer is made from a material such that a strain is thereby developed in response to a voltage applied to the gate electrode for offsetting the stress developed by the insulator. Thus, normally, or when no voltage is being impressed to the gate electrode, the device is physically held off by the action of the insulator and, upon voltage application to the gate electrode, piezoelectrically turns on by the action of the piezoelectric layer.

A feature of the invention resides in an insulator which is placed between the source and drain electrodes on the major surface of the main semiconductor region, with spacings from both electrodes and in underlying relationship to the gate electrode. The insulator develops a stress counteracting the intrinsic stress of one of the layers of the main semiconductor region in which the two-dimensional carrier gas layer is generated. Consequently, a hiatus appears in the two-dimensional carrier gas layer just under the insulator while no voltage is being impressed to the gate electrode. The device is therefore normally off.

Upon voltage application to the gate electrode, the piezoelectric layer, another feature of the invention, responds by developing a strain (stress) in a direction to cancel out the stress of the insulator. The result is the disappearance of the hiatus that has been created in the two-dimensional carrier gas layer by the insulator. Conduction is thus set up between the source and drain electrodes.

Still another feature of the invention resides in the fact that the insulator occupies only part of the spacing between the source and drain electrodes on the major surface of the main semiconductor region. The two-dimensional carrier gas layer is left intact at the other parts of this spacing. The turn-on resistance of the device is therefore much less than if the insulator occupied the complete spacing between the source and drain electrodes. There is thus obtained the desired normally-off field-effect semiconductor device of low turn-on resistance.

The placement of the insulator under the gate electrode serves the additional purpose of reducing gate leak current.

An embodiment is disclosed from which the insulator is absent; instead, one of the two semiconducting layers of dissimilar materials is trenched to create the required hiatus in the two-dimensional carrier gas layer in the normal state of the device. The dielectric layer is formed to include part extending through the trench into direct contact with the other of the two semiconducting layers. Upon voltage application to the overlying gate electrode, the piezoelectric layer is strained under the influence of the resulting field, causing a rise in carrier concentration in what has been the hiatus in, as well as in other parts of, the two-dimensional carrier gas layer. Thus is the device turned on with a minimum of turn-on resistance.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

The present invention will now be described more specifically as embodied in the HEMT-type field-effect semiconductor device shown in FIG. 1 of the drawings. The "HEMT-type field effect semiconductor device" is so named tentatively in this application because it differs in gate design from what is now generally known as the HEMT, but is akin thereto in operating principle. So the device shown in FIG. 1, as well as the additional devices shown in FIGS. 2-5, will be referred to as the "HEMT-type field-effect semiconductor device," or simply as "HEMT-type semiconductor device," or more simply as "HEMT-type device," or even more simply as "device." How the illustrated devices differ from the conventional HEMT will become apparent as the description proceeds.

Figure 1:
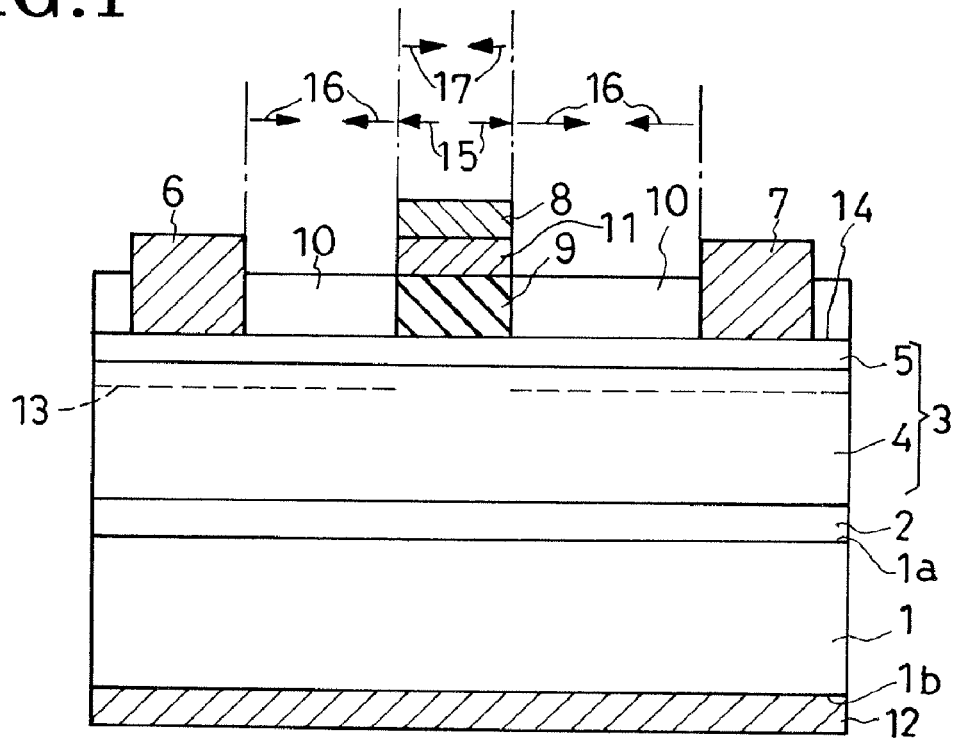
FIG. 1 is a schematic sectional view of a HEMT-type field-effect semiconductor device built on the novel principles of the present invention.

The representative HEMT-type field-effect semiconductor device of FIG. 1 includes a substrate 1 of semiconducting monocrystalline silicon having a pair of opposite major surfaces $1_a$ and $1_b$. Grown on the major surface $1_a$ of the substrate 1 via a buffer region 2 is a main semiconductor region 3 which is shown constituted of an electron transit layer 4 as a first layer and an electron supply layer 5 as a second layer. A source electrode 6, drain electrode 7, gate electrode 8, all standard HEMT components, are formed in selected positions on the main semiconductor region 3. Constituting the features of this invention are a first insulator 9 and second insulators 10 both in sheet or film form on the surface of the main semiconductor region 3, and a piezoelectric layer 11 overlying the first insulator 9 and itself overlain by the gate electrode 8. A back electrode 12 underlies the substrate 1.

The substrate 1 serves as: (a) a basis for epitaxially growing the buffer region 2 and main semiconductor region 3 thereon; (b) a mechanical support for all the overlying parts; and (c) an electroconductor for the underlying back electrode 12. The substrate is made from silicon for economy in this particular embodiment, but also adoptable are other materials including semiconductors such as silicon carbide and gallium nitride, and insulators such as sapphire and ceramics.

The buffer region 2 may be grown in vapor phase on the substrate 1 by any known or suitable method such as metalorganic chemical vapor deposition (MOCVD) also known as metalorganic vapor phase epitaxy (MOVPE). In practice the buffer region 2 may be either mono- or multi-layered. The multilayer option may comprise, for example, a desired number of alternations of an aluminum nitride (AlN) layer and a gallium nitride (GaN) layer. Being not too closely associated with the operation of the HEMT-type field-effect semiconductor device, however, the buffer region 2 is eliminable.

Grown epitaxially by MOCVD or the like on the buffer region 2, the electron transit layer 4 of the main semiconductor region 3 is made from undoped GaN to a thickness of, say, 1-5 micrometers. As indicated by the broken line labeled 13 in FIG. 1, the electron transit layer 4 provides, in cooperation with the overlying electron supply layer 5 yet to be detailed, the aforesaid two-dimensional electron gas layer as the channel adjacent the heterojunction between the layers 4 and 5. The electron transit layer 4 may be made from other compound semiconductors notably including the nitride semiconductors generally expressed as:

where the subscript a is a numeral that is equal to or greater than zero and less than one.

Grown epitaxially by MOCVD or the like on the electron transit layer 4, the electron supply layer 5 is made from undoped $Al_{0.3}Ga_{0.7}N$ to a thickness of, say, 5-50 nanometers, and is thinner than the electron transit layer 4. The electron supply layer 5 may be made from other compound semiconductors notably including the nitride semiconductors generally expressed as:

where the subscript x is a numeral that is greater than zero and less than one, preferably in the range of 0.2 through 0.4, and x is greater than a in the formula above defining the materials for the electron transit layer 4. The electron supply layer 5 must be greater in bandgap, and less in lattice constant, than the electron transit layer 4 for providing the two-dimensional electron gas layer 13. The electron supply layer 5 may be made from n-doped $Al_xGa_{1-x}N$, or other nitride semiconductors, or other compound semiconductors.

The source electrode 6 and drain electrode 7 are positioned with a required spacing from each other on the major surface 14 of the main semiconductor region 3. These electrodes 6 and 7 may be formed by first depositing titanium on the entire surface 14 to a thickness of, say, 25 nanometers, then depositing aluminum on the titanium layer to a thickness of, say, 500 nanometers, and then photolithographically patterning the superposed titanium and aluminum layers. The electrodes 6 and 7 may be made from some other metal or combinations of other metals, provided that such a metal or metals are capable of low-resistance (ohmic) contact with the electron supply layer 5. Being so thin, the electron supply layer 5 is negligibly small in resistance in its thickness direction. The electrodes 6 and 7 are therefore electrically coupled to the two-dimensional electron gas layer 13.

The first insulator 9 is placed on the major surface 14 of the main semiconductor region 3 so as to underlie the gate electrode 8 in register therewith, occupying only part of the spacing between source electrode 6 and drain electrode 7. The first insulator 9 is made from a material such that it gives rise to a stress oriented to lessen the concentration of carriers (e.g., electrons) in underlying part of the two-dimensional electron gas layer 13, as will be detailed in the following paragraphs. An example of materials capable of performing this function is silicon nitride (SiN), which may be grown on the surface 14 by plasma-enhanced chemical vapor deposition for example.

So formed, as indicated by the arrows 15 in FIG. 1, the SiN-made first insulator 9 develops a tensile stress (expansive strain) of, say, $-6.14 \times 10^9$ $dyn/cm^2$ parallel to the major surface 14 of the main semiconductor region 3. This stress due to the first insulator 9 is oriented to counteract the tensile stress (expansive strain) that develops in the electron supply layer 5 due to the heterojunction between this electron supply layer and the electron supply layer 5, thereby serving to reduce the carrier concentration in part of the two-dimensional carrier gas layer, that is, to create a hiatus or discontinuity in that layer.

Let us consider the normal state (no voltage applied to the gate electrode 8) of this HEMT-type field-effect semiconductor device. When acted upon by the tensile stress due to the first insulator 9, the AlGaN-made electron supply layer 5 will experience a compressive stress (opposite in direction to the arrows 15) at its part right under the first insulator 9. This compressive stress on part of the electron supply layer 5 will cancel out the tensile stress (expansive strain) acting on the electron supply layer 5 due to its heterojunction with the electron transit layer 4. The two-dimensional electron gas layer 13 will therefore be interrupted at that part of the heterojunction which underlies the first insulator 9. There will be no source-drain conduction; that is, the device is normally off.

As is clear from the foregoing, for the normally-off operation of this HEMT-type device, the first insulator 9 must be capable of exerting a sufficient compressive stress on the noted part of the electron supply layer 5 to offset there the tensile stress (expansive strain) generated therein due to its heterojunction with the electron transit layer 4. The first insulator 9 must be thicker than the electron supply layer 5 for accomplishment of this purpose. A thickness range of 50-1000 nanometers is currently recommended for the first insulator 9.

The second insulators 10, another feature of the invention, are formed on those parts of the major surface 14 of the main semiconductor region 3 which are left uncovered by the electrodes 6 and 7 and first insulator 9. The second insulators 10 are made from a material such that they develop stresses oriented to add to the carrier concentration of the two-dimensional carrier gas layer 13. Materials meeting this requirement includes silicon oxides defined as $SiO_x$ where the subscript x is a numeral in the range of 1-2, preferably two. For the best results, the second insulators 10 may be formed by plasma-enhanced chemical vapor deposition to a thickness of approximately 300-800 nanometers, preferably 500 nanometers. The second insulators 10 are thicker than the electron supply layer 5. The thus-formed second insulators 10 will develop compressive stresses, or compressive strains, of $4.00 \times 10^9$ $dyn/cm^2$ or thereabouts, as indicated by the arrows 16 in FIG. 1.

With the second insulators 10 of silicon oxide deposited as above on the AlGaN-made electron supply layer 5, this layer when acted upon by the compressive stresses due to the second insulators 10 will react by developing expansive strains (tensile stresses). The piezoelectric depolarization of the electron supply layer 5 will thus be intensified, resulting in a rise in the electron concentration of the two-dimensional electron gas layer 13. This rise in electron concentration is conducive to the reduction of resistance between the source and drain electrodes 6 and 7 when the device is turned on.

The piezoelectric layer 11, still another feature of the invention, is interposed between the gate electrode 8 and the first insulator 9 for canceling out the stress of the first insulator in response to a voltage impressed to the gate electrode 8. The piezoelectric layer 11 is made from a material capable of straining so as to offset the stress of the first insulator 9 when subjected to an electric field.

Materials meeting this requirement include zinc oxide (ZnO) admixed with less than five, preferably one to two, percent by weight of lithium (Li) or nickel (Ni) or other transition metal. The addition of such transition metal or nickel or lithium is intended to make semiconducting ZnO higher in resistance, so that they need not be added in those applications of the invention where the piezoelectric layer 11 need not be highly resistive. ZnO may be sputtered to form the piezoelectric layer 11. Other employable materials include the oxides, known as PZT, consisting essentially of lead (Pb), zirconium (Zr) and titanium (Ti), such as the mixture of lead zirconium oxide ($PbZrO_3$) and lead titanium oxide ($PbTiO_3$, the oxides, known as LTO, consisting essentially of lanthanum (La) and titanium (Ti), such as (La, $Ti)O_3$, and a variety of other piezoelectric materials such as polycrystalline aluminum nitride (AlN). For the best results, the piezoelectric layer 11 may be formed by sputtering to a thickness of approximately 50-1000 nanometers. The piezoelectric layer 11 is thicker than the electron supply layer 5.

As indicated by the arrows 17 in FIG. 1, the piezoelectric layer 11 develops a compressive strain (compressive stress) in response to the control voltage impressed to the gate electrode 8. The compressive strain of the piezoelectric layer 11 is oriented to cancel out the expansive strain of the first insulator 9, with consequent creation of a two-dimensional electron gas layer along the heterojunction between the electro transit layer 4 and electron supply layer 5. The interruption of the two-dimensional electron gas layer 13 by the first insulator 9 is now nullified, and conduction re-established between the source electrode 6 and drain electrode 7.

The gate electrode 8 may be made from metal on the piezoelectric layer 11. Electroconductive polysilicon is an example of possible substitutes for metal as electrode material. It is understood that the back electrode 12 on the underside $1_b$ of the substrate 1 is electrically coupled to the source electrode 6 for stable operation of this HEMT-type device.

In the operation of this normally-off HEMT-type field-effect semiconductor device, when no voltage is being applied to the gate electrode 8, the two-dimensional electron gas layer 13 is physically broken into two under the influence of the first insulator 9 even if the drain electrode 7 is higher in potential than the source electrode 6. There is no source-to-drain electron flow along this channel. The device is off.

For turning the device on, a voltage in excess of a predefined threshold may be applied between the source electrode 6 and gate electrode 8, with the drain electrode 7 held higher in potential than the source electrode 6. Thereupon the piezoelectric layer 11 under the gate electrode 8 will develop a compressive strain (compressive stress). This compressive strain will offset the expansive strain (expansive stress) of the underlying first insulator 9, thereby preventing the application of the expansive stress from the first insulator to the electron supply layer 5. The part of the electron supply layer 5 underlying the gate electrode 8 will then undergo piezoelectric polarization, as does the other part of the electron supply layer, so that the two-dimensional electron gas layer 13 will appear all along the heterojunction between the electron transit layer 4 and electron supply layer 5.

Thus is conduction established between the source electrode 6 and drain electrode 7. Electrons flow during this conducting state of the device along the path sequentially comprising the source electrode 6, electron supply layer 5, two-dimensional electron gas layer 13, electron supply layer 5, and drain electrode 7. The electron supply layer 5 is so thin that electrons can traverse it in its thickness direction.

Optionally, there may be impressed to the gate electrode 8 a voltage higher than that needed for canceling out the expansive strain of the first insulator 9 by the compressive strain of the piezoelectric layer 11. The two-dimensional electron gas layer 13 will become even higher in electron concentration at its part under the gate electrode 8.

The advantages gained by this HEMT-type field-effect semiconductor device may be recapitulated as follows:

1. Normally, when no voltage is being impressed to the gate electrode 8, the device does not conduct because the two-dimensional electron gas layer 13 is physically split up in the middle under the stress due to the first insulator 9 occupying part of the spacing between the source electrode 6 and drain electrode 7. A normally-off HEMT-type device is thus obtained.
2. The gate electrode 8, first insulator 9 and piezoelectric layer 11 are all placed one upon another at part of the spacing between the source electrode 6 and drain electrode 7. In the rest of this spacing the two-dimensional electron gas layer is free from the influence of the first insulator 9 and so does not have its electron concentration reduced. The device is therefore relatively low in turn-on resistance despite being normally off.
3. Again because the gate electrode 8, first insulator 9 and piezoelectric layer 11 are all stacked at part of the spacing between the source electrode 6 and drain electrode 7, the gate electrode can be sufficiently spaced from these electrodes 6 and 7 to assure high gate-source and gain-drain antivoltage strengths.
4. The second insulators 10 of silicon oxide or the like serve to add to the electron concentration of the two-dimensional electron gas layer 13 and hence to reduce the turn-on resistance between the source electrode 6 and drain electrode 7.
5. The two-dimensional electron gas layer 13 can be made higher in electron concentration for reduction of turn-on resistance than in the prior art HEMT which is made normally off by making the electron supply layer 5 extremely thin.
6. Gate leak current is reduced thanks to the first insulator 9 interposed between the main semiconductor region 3 and gate electrode 8.

Figure 2:
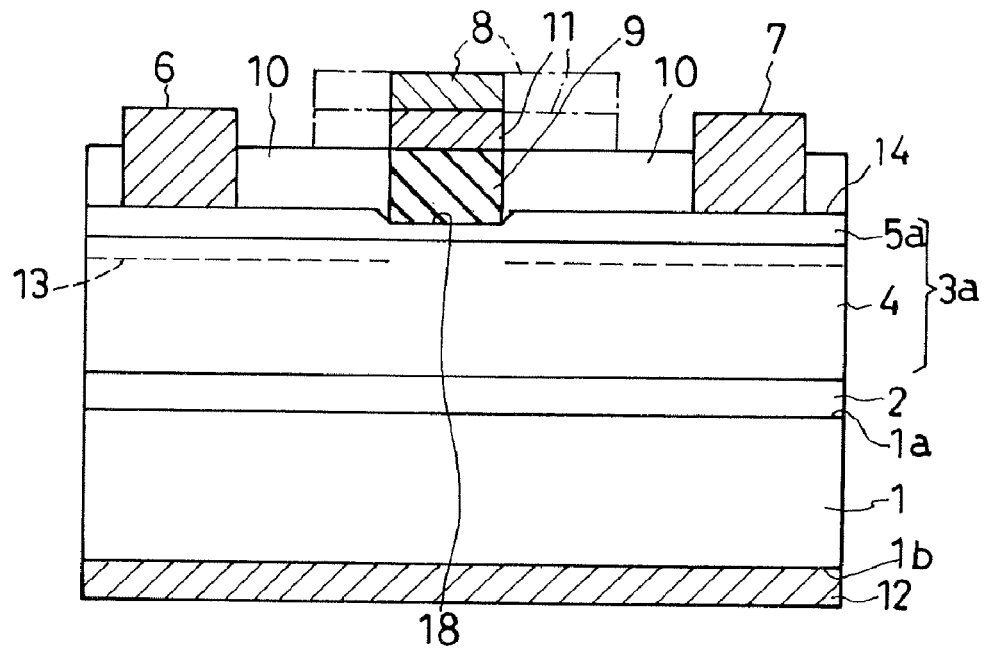
FIG. 2 is a schematic sectional view of another preferred form of HEMT-type field-effect semiconductor device according to the invention.

Embodiment of FIG. 2

The alternate form of HEMT-type field-effect semiconductor device shown here differs from its FIG. 1 counterpart in having a modified electron supply layer $5_a$ in its main semiconductor region $3_a$. The electron supply layer $5_a$ has its surface 14 recessed at 18 just under the stack of the gate electrode 8, first insulator 9 and piezoelectric layer 11. The recess 18 is sized to accommodate some lowermost part of the first insulator 9. All the other constructional details of this alternate device are as previously set forth with reference to FIG. 1.

Let it be assumed that the recessed part of the electron supply layer $5_a$ is as thick as the unrecessed electron supply layer 5 of the first disclosed device. Then, naturally, the other, unrecessed parts of the electron supply layer $5_a$ are thicker than the unrecessed electron supply layer 5. The electric fields due to the piezoelectric and spontaneous depolarizations of these unrecessed parts of the electron supply will therefore be stronger, thereby making the two-dimensional electron gas layer 13 higher in electron concentration and so lowering the turn-on resistance of the device.

It is also possible to make the recessed part of the electron supply layer $5_a$ less thick than the unrecessed electron supply layer 5 of the first disclosed device. Then the electric field due to the piezoelectric and spontaneous depolarizations of this thin recessed part of the electron supply layer $5_a$ will be correspondingly less strong. As a result, the desired splitting up of the two-dimensional electron gas layer 13 will be accomplished even if the expansive strain of the first insulator 9 is less than that in the first disclosed device.

This alternate device is the same in fundamental design as the first disclosed device. It is therefore self-evident that it gains all the advantages listed in connection with the first embodiment.

Figure 3:
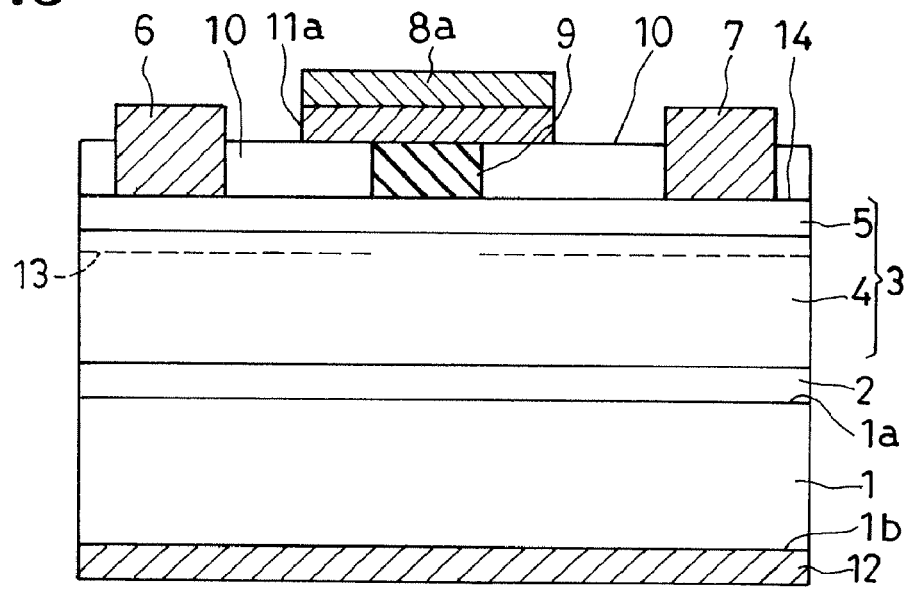
FIG. 3 is a schematic sectional view of still another preferred form of HEMT-type field-effect semiconductor device according to the invention.

Embodiment of FIG. 3

This HEMT-type device differs from that of FIG. 1 in having a gate electrode $8_a$ and piezoelectric layer $11_a$ which have both a dimension (width) greater than their FIG. 1 counterparts 8 and 11 in a direction extending between the source electrode 6 and gate electrode 7. Both gate electrode $8_a$ and piezoelectric layer $11_a$ project laterally beyond the opposite longitudinal edges of the first insulator 9 onto the second insulators 10 and terminate appropriate distances (to be explained later) away from the source electrode 6 and gate electrode 7. All the other details of construction are as previously set forth with reference to FIG. 1.

The normal state of this device is also considered apparent from the foregoing operational description of the first disclosed device. When no voltage is impressed to the gate electrode $8_a$, the two-dimensional electron gas layer 13 between the source electrode 6 and gate electrode 7 is fissured under the first insulator 9 by the action of this film, preventing electron flow between these electrodes.

Upon voltage application to the gate electrode $8_a$, the piezoelectric layer $11_a$ functions as aforesaid to fill up the fissure in the two-dimensional electron gas layer 13 under the first insulator 9. The result is conduction between the source electrode 6 and drain electrode 7. The device turns on.

At the same time the compressive strain (compressive stress) of the wider piezoelectric layer $11_a$ acts on the electron supply layer 5 via the second insulators 10 to intensify its piezoelectric depolarization. The result is a higher electron concentration of the two-dimensional electron gas layer 13, which in turn brings about a drop in turn-on resistance between the electrodes 6 and 7. This device is therefore low in turn-on resistance despite being normally off.

There is an additional benefit accruing from the wider gate electrode $8_a$ and piezoelectric layer $11_a$ which extend onto the second insulators 10. The two-dimensional electron gas layer 13 that has been completed to turn the device on is better consolidated or integrated, so to say, thanks to the greater widths of the gate electrode $8_a$ and piezoelectric layer $11_a$, assuring an unfailing electron flow between the electrodes 6 and 7.

It will be apparent that this device possesses substantially all the advantages listed in conjunction with the first disclosed device. However, because the gate electrode $8_a$ is wider and closer to the two other electrodes 6 and 7, this device is less in gate-source and gate-drain antivoltage strengths than the first embodiment. These antivoltage strengths should be taken into account in determination of the width of the gate electrode $8_a$, that is, the noted distances of its opposite edges from the electrodes 6 and 7.

Figure 4:
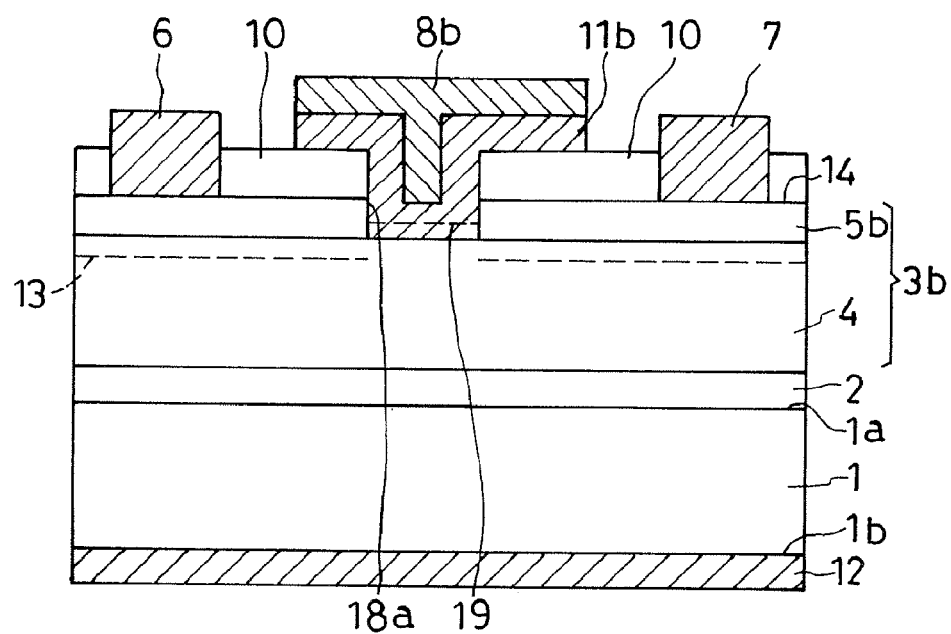
FIG. 4 is a schematic sectional view of yet another preferred form of HEMT-type field-effect semiconductor device according to the invention.

Embodiment of FIG. 4

This embodiment differs from all the preceding ones in not having the first insulator 9 and in having a main semiconductor region $3_b$, gate electrode $8_b$ and piezoelectric layer $11_b$ of slightly modified shape. The other details of construction are as described above with reference to FIG. 3.

The electron supply layer $5_b$ of the main semiconductor region $3_b$ has a trench $18_a$ midway between the electrodes 6 and 7. The trench $18_a$ extends from the major surface 14 of the main semiconductor region $3_b$ down to the electron transit layer 4. The insulators 10 on the major surface 14 of the main semiconductor region $3_b$ may be thought of as defining a similar trench in register with the trench $18_a$ in the electron supply layer $5_b$.

The piezoelectric layer $11_b$ is here reshaped to include a portion extending from over the insulators 10 into the trench $18_a$ and bottomed against the electron transit layer 4. The gate electrode $8_b$ is correspondingly reshaped to conform to the shape of the preformed piezoelectric layer $11_b$. Grown directly on the main semiconductor region 3, rather than on the insulator 9 as in the three preceding embodiments, the piezoelectric layer $11_b$ will be better in crystallinity and better perform its intended functions.

Normally, a discontinuity occurs in the two-dimensional electron gas layer at that part of the electron transit layer 4 which underlies the trench $18_a$ in the electron supply layer $5_b$. The device is therefore normally off. Upon voltage application to the gate electrode $8_b$, the piezoelectric layer $11_b$ functions as gate insulator and creates a current path in the underlying part of the electron transit layer 4 by virtue of the familiar field effect. Conduction is thus established between the source electrode 6 and drain electrode 7.

This embodiment gains all the benefits recited in connection with that of FIG. 1. Additionally, as the gate electrode $8_a$ and piezoelectric layer $11_b$ are both formed to include portions overlying the $SiO_x$-made insulators 10 as in the FIG. 3 embodiment, a lower turn-on resistance is obtained here too.

Optionally, the trench $18_a$ in the electron supply layer $5_b$ may be terminated short of the electron transit layer 4, as indicated by the broken line designated 19 in FIG. 4. It is well known with HEMTs of familiar make that a two-dimensional electron gas layer is unobtainable in the electron transit layer if the overlying electron supply layer is too thin. In this device of FIG. 4, therefore, no conduction will normally occur between the electrodes 6 and 7 even if the trench $18_a$ is not open to the electron transit layer 4.

Figure 5:
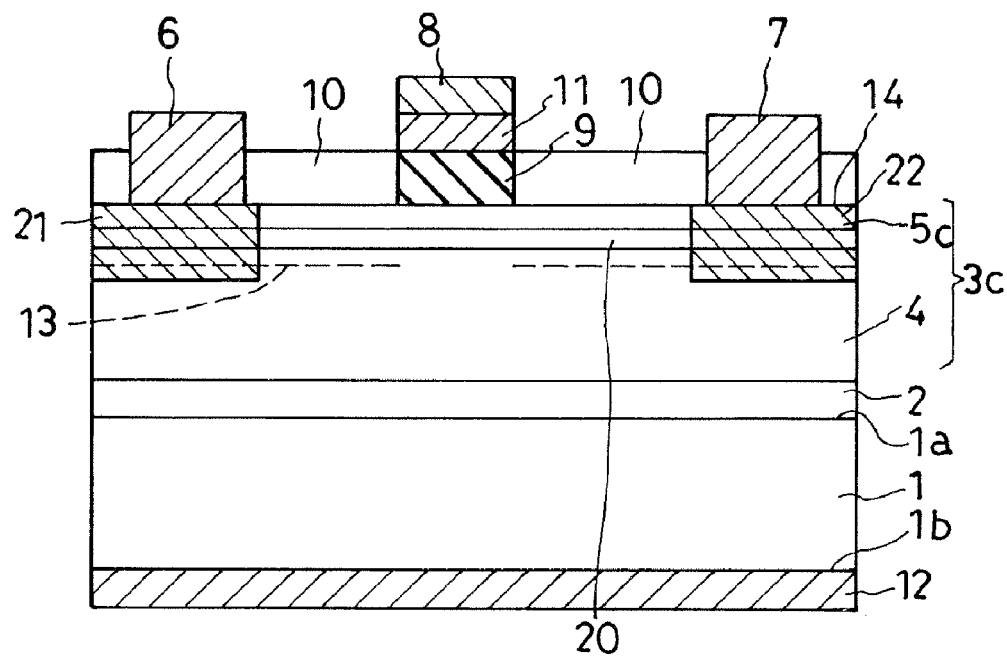
FIG. 5 is a schematic sectional view of a further preferred form of HEMT-type field-effect semiconductor device according to the invention.

Embodiment of FIG. 5

The electrodes 6-8, insulators 9 and 10, and piezoelectric layer 11 of the HEMT-type device are of the same configuration as their counterparts designated by the same reference numerals in FIG. 1. Differences of this FIG. 5 device from that of FIG. 1 reside in its main semiconductor region $3_c$.

The main semiconductor region $3_c$ comprises an electron transit layer 4 of GaN, an electron supply layer $5_c$ of n-doped $Al_xGa_{1-x}N$, and a spacer layer 20, itself well known in the art, of undoped AlN interposed between the layers 4 and $5_c$. Further, as indicated by the hatchings, two n-doped contact subregions 21 and 22 are formed in those parts of the main semiconductor region $3_c$ which immediately underlie the source electrode 6 and drain electrode 7. This embodiment is akin in all the other details of construction to that of FIG. 1.

The spacer layer 20 functions to diminish the diffusion of the impurities or elements from electron supply layer $5_c$ into electron transit layer 4 decrease and hence to enhance electron mobility in the two-dimensional electron gas layer 17. The contact subregions 21 and 22 of the main semiconductor region $3_c$ serve to lessen the contact resistance of the electrodes 6 and 7 with the main semiconductor region $3_c$.

It is now apparent that this FIG. 5 device is totally unaltered in fundamental operating principle from that of FIG. 1. As will also be readily understood, the spacer layer 10 and contact regions 21 and 22 of this embodiment could be incorporated in those of FIGS. 2-4. Further, like the electron supply layer $5_c$ of this embodiment, its counterparts 5, $5_a$ and $5_b$ of the FIGS. 1-4 embodiments could all be n-doped.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative HEMT-type field-effect semiconductor devices which are all believed to fall within the purview of the claims annexed hereto:

1. The main semiconductor regions 3 and $3_a$-$3_c$ of the illustrated embodiments could made from compound semiconductors other than GaN and AlGaN, such as other Groups III-V compound semiconductors including InGaN, AlInGaN, AlN, InAlN, AlP, GaP, AlInP, GaInP, AlGaP, AlGaAs, GaAs, AlAs, InAs, InP, InN, and GaAsP, and Groups II-VI compound semiconductors including ZnO.

2. The electron supply layers 5 and 5$_a$-5$_c$ of the illustrated embodiments are replaceable by a hole supply layer of p-type semiconducting material, in which case a two-dimensional hole gas layer will appear in lieu of the two-dimensional electron gas layer 13.

3. As indicated in phantom outline in FIG. 2, the gate electrode 8 and piezoelectric layer 11 of this embodiment could be made wider to overlie parts of the second insulating layer 10 for reduction of turn-on resistance, as has been discussed in conjunction with the wider gate electrode 8$_a$ and piezoelectric layer 11$_a$ of the FIG. 3 embodiment.

4. An insulator could be interposed between the electron transit layer 4 and piezoelectric layer 11$_b$ of the FIG. 4 embodiment for reduction of gate leak current.

5. Any one or more of a known gate field plate, source field plate, and drain field plate could be incorporated in the devices disclosed herein.

6. What is known as a cap layer of undoped GaN or the like could be provided atop any of the main semiconductor regions 3 and 3$_a$-3$_c$ for surface charge control.

7. Two or more of each of the electrodes 6-8 could be provided.

8. In the first four embodiments shown, the electron supply layer 5, 5$_a$ or 5$_b$ could be removed from under the source electrode 6 and drain electrode 7, permitting these electrodes to make direct contact with the electron transit layer 4.

9. The first insulator 9 could be made from silicon nitrides other than SiN, such as SiN$_x$ (where the subscript x is a numeral indicative of the ratio of N to Si), Si$_2$N$_3$, and Si$_3$N$_4$, or from other insulating materials capable of developing a tensile stress (expansive strain) parallel to the major surface 14 of the main semiconductor region 3.

10. The second insulators 10 could be made from some insulating material other than SiO$_x$ that is capable of developing a compressive stress (compressive strain).

What is claimed is:

1. A field-effect semiconductor device comprising:
   (a) a main semiconductor region having a first and a second layer of dissimilar semiconducting materials such that a two-dimensional carrier gas layer is generated along a heterojunction therebetween, the main semiconductor region having a major surface defined by the second layer;
   (b) a source electrode on the major surface of the main semiconductor region;
   (c) a drain electrode on the major surface of the main semiconductor region spaced from the source electrode;
   (d) an insulator placed between the source electrode and the drain electrode on the major surface of the main semiconductor region with spacings from both electrodes, the insulator being made from a material capable of developing a stress to reduce carrier concentration in the two-dimensional carrier gas layer in the main semiconductor region;
   (e) a gate electrode on the insulator for control of conduction between the source electrode and the drain electrode; and
   (f) a piezoelectric layer intermediate the gate electrode and the insulator, the piezoelectric layer being made from a material such that a strain is developed in response to a voltage applied to the gate electrode for offsetting the stress developed by the insulator.

2. A field-effect semiconductor device as defined in claim 1, further comprising second insulators on the major surface of the main semiconductor region in the spacings between the insulator and the source electrode and drain electrode, the second insulators being made from a material such that stresses are developed to add to carrier concentration in the two-dimensional carrier gas layer.

3. A field-effect semiconductor device as defined in claim 2, wherein the gate electrode and the piezoelectric layer are both formed to include portions extending onto the second insulators.

4. A field-effect semiconductor device as defined in claim 2, wherein the second insulator is made from silicon oxide.

5. A field-effect semiconductor device as defined in claim 1, wherein the gate electrode and the piezoelectric layer are both formed to include portions extending onto the spacings between the insulator and the source electrode and drain electrode.

6. A field-effect semiconductor device as defined in claim 1, wherein the first layer of the main semiconductor region is an electron transit layer, wherein the second layer of the main semiconductor region is an electron supply layer, and wherein the insulator is made from a material capable of developing a tensile stress and is thicker than the electron supply layer.

7. A field-effect semiconductor device as defined in claim 1, wherein the insulator is made from silicon nitride.

8. A field-effect semiconductor device as defined in claim 1, wherein the piezoelectric layer is made from a material selected from among zinc oxide admixed with a transition metal or lithium, oxides consisting essentially of lead and zirconium and titanium, and oxides consisting essentially of lanthanum and titanium.

9. A field-effect semiconductor device as defined in claim 1, wherein the main semiconductor region further comprises a spacer layer between the first and the second layer.

10. A field-effect semiconductor device as defined in claim 1, wherein the second layer of the main semiconductor region is recessed under the gate electrode.

11. A field-effect semiconductor device as defined in claim 1, wherein the main semiconductor region is formed to include contact subregions for lowering the resistance of contact of the source electrode and gate electrode with the main semiconductor region.

* * * * *